United States Patent [19]

van Glabbeek

[11] Patent Number: 4,590,616
[45] Date of Patent: May 20, 1986

[54] RE-TUNING DEVICE COMPRISING A SWITCHING MIXER STAGE AND A TUNING OSCILLATOR

[75] Inventor: Hendrik F. van Glabbeek, Eindhoven, Netherlands

[73] Assignee: U.S. Philips Corporation, New York, N.Y.

[21] Appl. No.: 628,174

[22] Filed: Jul. 6, 1984

[30] Foreign Application Priority Data

Jul. 12, 1983 [NL] Netherlands .......................... 8302481

[51] Int. Cl.[4] .............................................. H04B 1/26
[52] U.S. Cl. .................................... 455/319; 455/326; 455/333
[58] Field of Search ................ 455/313, 333, 318–320, 455/323, 326; 307/263, 271, 290; 331/113 R

[56] References Cited

U.S. PATENT DOCUMENTS

| | | | |
|---|---|---|---|
| 3,665,343 | 5/1972 | Thompson | 331/113 R |
| 4,268,916 | 5/1981 | Kusakabe | 455/333 |
| 4,313,221 | 1/1982 | Mattfeld | 455/319 |
| 4,385,401 | 5/1983 | Jagnow et al. | 455/333 |

FOREIGN PATENT DOCUMENTS 2008881 6/1979 United Kingdom .

OTHER PUBLICATIONS

"An Automatic Equalizer for Echo Reduction in Teletext on a Single Chip", by Voorman et al., Philips Technical Review, vol. 40, 1982, No. 11/12.
"Philips Data Handbook" C2, No. 12, 1982, TV-Tuners, Video Modulators and Saw-Filters, pp. 141–143.

*Primary Examiner*—Jin F. Ng
*Attorney, Agent, or Firm*—Thomas A. Briody; William J. Streeter; Edward W. Goodman

[57] ABSTRACT

RF-tuning device comprising a switching mixer stage (M) and a tuning oscillator (O) coupled thereto. According to the invention, so as to reduce the noise contribution of the mixer stage (M) without increasing the oscillator radiation, the slew rate of the oscillator switching signal applied to the mixer stage (M) is increased by connecting bistable trigger circuit between the tuning oscillator and the mixing stage. Under the control of the tuning oscillator, the bistable trigger circuit generates a substantially square-wave output signal.

3 Claims, 1 Drawing Figure

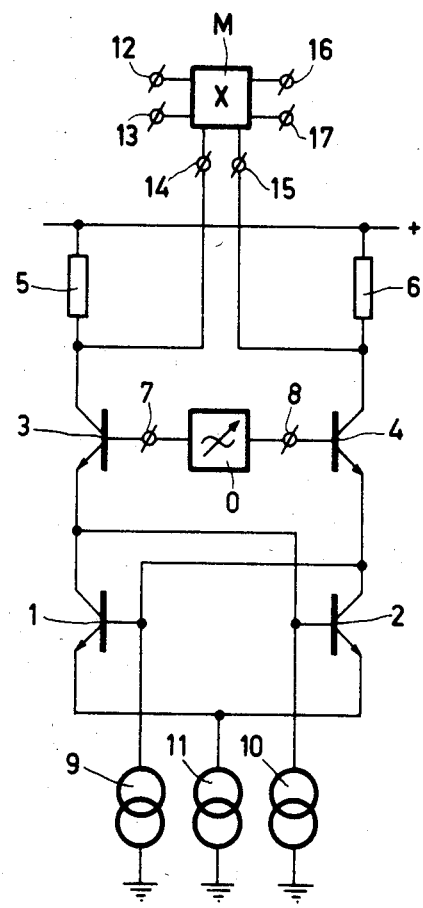

RE-TUNING DEVICE COMPRISING A SWITCHING MIXER STAGE AND A TUNING OSCILLATOR

BACKGROUND OF THE INVENTION

The invention relates to an RF-tuning device comprising a switching mixer stage and a tuning oscillator coupled thereto.

Such an RF-tuning device is used in the TV-UHF/VHF tuning unit UV 411 described in the "Philips Data Handbook", C2, No. 12, 1982 "TV-tuners, Video-Modulators and SAW-filters", pages 141–143, published by Philips Electronic Components and Materials Division.

In the prior art RF-tuning device, additive mixing of a desired TV-VHF receiving signal with an oscillator signal is effected at the base-emitter junction of the mixing transistor, the mixing transistor being switched by the oscillator signal. Because of the signal gains in the signal processing operations effected subsequent to the RF-tuning device before the desired TV-signal is suitable for display, the inherent noise contribution or the noise factor, as the case may be, of the RF-tuning device and more specifically the noise factor of the mixer stage comprised therein, must be kept as low as possible.

It is known that the noise factor of the mixer stage can be reduced by increasing the amplitude of the oscillator signal. However, increasing the oscillator signal also results in an increase of oscillator radiation. As the requirements as regards the maximum permissible oscillator radiation are very strict in some countries, and moreover a large, stable and tunable oscillator signal cannot be realized with simple means, this manner of reducing noise can, in practice, only be used to a limited extent.

SUMMARY OF THE INVENTION

The invention has for its object to reduce the noise factor of the switching mixer stage in an RF-tuning device without increasing the oscillator amplitude.

According to the invention, an RF-tuning device of the type set forth in the opening paragraph is characterized in that a bistable trigger circuit is arranged between the tuning oscillator and the mixer stage to increase the slope—also indicated as slew rate—of the oscillator signal.

The invention makes use of the fact that the noise in each switching element of the mixer stage predominantly occurs during a certain portion in the transition from the conducting to the non-conducting state and vice versa and that the time during which this noise occurs, i.e. what is commonly referred to as the noise period during these transitions, determines the noise factor of the mixer stage to a significant extent.

When the measure according to the invention is used, these transitions are passed very rapidly because of the particularly large slope of the oscillator signal which can generally be accomplished with bistable trigger circuits. As a result thereof, the noise factor of the mixer stage is significantly limited, while the amplitude of the oscillator signal applied to the bistable trigger circuit needs only to be sufficiently large to initiate it and the amplitude of the oscillator signal applied to the mixer stage need only to be sufficiently large to switch the mixer stage.

Furthermore, from the United Kingdom Patent Specification No. 2008881 a frequency-conversion circuit is known per se, which comprises a cascode circuit formed by a multiplicative mixer stage and a tuning oscillator. This prior art tuning oscillator is realized by means of a pair of transistors having cross-coupled base and collector electrodes and whose emitters are supplied from two emitter current sources, a frequency-determining LC-resonant circuit being arranged between these emitters. As this circuit, for frequencies unequal to the resonant frequency, constitutes an impedance between the emitters of said pair of transistors, transient phenomena occur on switching of the pair of transistors, as a result of which the slope of the oscillator signal at the collector outputs of the pair is considerably less than the slope of the output signal of a bistable trigger circuit and, in addition, depends on the amplitude of this oscillator signal.

Consequently, when the measure is applied to this known frequency-conversion circuit, the above-mentioned advantages are also obtained, while furthermore the bistable trigger circuit according to the invention significantly reduces pulling of the oscillator frequency by a strong adjacent frequency.

A preferred embodiment of an RF-tuning device according to the invention is characterized in that the bistable trigger circuit comprises a differential input stage and a Schmitt trigger connected thereto, the differential input stage being coupled to an output of the tuning oscillator and the Schmitt trigger being coupled to a multiplying circuit included in the switching mixer stage.

When this measure is used a balanced multiplicative mixing operation is effected by means of an unbalanced tuning oscillator, the oscillator signal of which may have a particularly small amplitude.

A further preferred embodiment is characterized in that the Schmitt-trigger comprises first and second transistors, the base inputs of the transistors being cross-coupled to the opposite collector outputs and being connected to respective first and second d.c. sources and the emitters of these transistors being connected to a common third direct current source, the current through the first and second direct current sources being mutually substantially equal and the current through the third direct current source being not more than eight times the current through each of the first and second direct current sources, and that the differential input stage comprises third and fourth mutually balanced transistors, whose base inputs are connected to the output of the tuning oscillator and whose collector outputs are connected to a balanced input of the multiplicative multiplying circuit.

Such a realization of the bistable trigger circuit is known per se from the article "An Automatic Equalizer for Echo Reduction in Teletext on a Single Chip": by J. O. Voorman, P. J. Snijder, J. S. Vromans and P. J. Barth, *Philips Technical Review*, Vol. 40, No. 11/12, 1982, pages 319–328.

In an RF-tuning device according to the invention this trigger circuit, which is known per se, provides the possibility to keep the hysteresis of the bistable trigger circuit very low at a very low current consumption by using the measure according to the invention, so that, on the one hand, the oscillator signal applied to the mixer stage is a substantially symmetrical square-wave signal and, on the other hand, the signal supplied by the tuning oscillator can be small.

DESCRIPTION OF THE DRAWING

The invention will now be described in greater detail with reference to the sole FIGURE shown in the accompanying drawing, which FIGURE illustrates an example of an RF-tuning device according to the invention.

DESCRIPTION OF THE PREFERRED EMBODIMENT

The RF-tuning device according to the invention shown in the FIGURE comprises a balanced switching mixer stage M having a balanced RF-signal input 12, 13, a balanced oscillator mixing input 14, 15 and a balanced IF-output 16, 17, and also optionally, an unbalanced tuning oscillator O and a bistable trigger circuit 1-11 arranged between the tuning oscillator O and the mixer stage M.

The balanced switching mixer stage M is of a known configuration and may, for example, correspond to the balanced multiplicative, switching mixer stage used in the integrated circuit TDA 7000. To understand the invention, it is sufficient to mention that the mixer stage M mixes in the switching mode, a balanced RF-signal applied to the RF signal input 12, 13 with a balanced square-wave oscillator signal applied to the oscillator mixing input 14, 15 which results in a balanced IF-signal at the IF-output 16, 17. The duration of the transitions of the switching elements of the mixer stage M involved in the switching-mixing procedure, that is to say the transition from the conducting to the non-conducting states of these switching elements is determined by the slew rate of the square-wave pulses and the oscillator signal applied to the mixer stage 11.

The frequency of the square-wave oscillator signal is determined by the tuning oscillator O which applies optionally, a sinusoidal oscillator signal to the oscillator inputs 7 and 8 of the bistable trigger circuit 1-11.

The tuning oscillator O is also of a known configuration and may, for example, be an unbalanced Collpits oscillator. One of the oscillator inputs 7 or 8 may then be connected to ground for alternating current (not shown).

The bistable trigger circuit 1-11 comprises a cross-quad 1-4 which is known per se from the above-mentioned article by Voorman et al. This cross-quad which is known per se comprises a pair of transistors 1, 2 which function as a Schmitt trigger and whose base inputs are connected, on the one hand, cross-wise to the opposite collector outputs, and on the other hand, to first and second direct current sources 9 and 10, which carry direct currents $I_9$ and $I_{10}$, respectively. The emitters of the pair of transistors 1, 2 are interconnected and coupled to a third direct current source 11 which carries direct current $I_{11}$. The base inputs/collector outputs of the pair of transistors 1, 2 are connected to the emitters of a pair of transistors 3, 4.

In contrast to said known quad 1-4, the present bistable trigger circuit 1-11 is driven from the base inputs of the pair of transistors 3, 4, which inputs function as oscillator inputs 7 and 8, and the collectors of this pair of transistors 3, 4 form a balanced output of the bistable trigger circuit 1-11. To that end, these collectors are switched, on the one hand, via collector resistors 5 and 6 to a supply voltage and, on the other hand, to the balanced oscillator mixing input 14, 15 of the mixer stage M. The collector resistors 5 and 6 determine the output impedance of the bistable trigger circuit 1-11 and also, together with the magnitude of the direct current $I_{11}$, the amplitude of the oscillator signal which is applied to the mixer stage M as a switching signal.

The transistors 3 and 4 function inter alia as a differential input stage which allows freedom in the choice for the tuning oscillator O to be of a balanced or an unbalanced construction. It is therefore possible, for example when used in integrated circuits, to use a simple, unbalanced one-pin oscillator as the tuning oscillator.

The quiescent currents through the transistors 3 and 4 are set by means of the currents $I_9$ and $I_{10}$ of the current sources 9 and 10 and are chosen to be mutually equal to provide a correct balance. The current switched by the pair of transistors 1, 2 is set with the aid of the current $I_{11}$ from the current source 11 and, together with the currents $I_9$ and $I_{10}$, must be chosen such that the loop gain of the pair of transistors 1, 2 is at least sufficiently large to have this pair function as a Schmitt trigger. A test effected on a practical embodiment showed that this was accomplished when $I_9$ and $I_{10}$ each had a value of at least 0.5 mA and $I_{11}$ had a value of at least 1 mA.

For the Schmitt trigger 1, 2, the transistors 3 and 4 are arranged as emitter followers, so that a positive oscillator voltage at, or a positive voltage difference between, the oscillator inputs 7 and 8, as the case may be, (that is to say the base voltage of the transistor 3 exceeds the base voltage of the transistor 4) results in a positive voltage difference between the emitters of the transistors 3 and 4 and a negative voltage difference between the bases of the Schmitt trigger 1, 2. This causes the transistor 2 to conduct and the transistor 1 of the Schmitt trigger 1, 2 to be cutoff. Then approximately the quiescent current $I_{10}$ flows through the transistor 3 and approximately the sum of the currents $I_9$ and $I_{11}$ flows through the transistor 4.

In the case of a negative voltage difference between the base inputs 7 and 8, the conduction state of the transistors 1 and 2 is mutually inverted, as is also the current ratio through the transistors 3 and 4. As a result of the high positive feedback between the transistors 1 and 2 mutually, the one conduction stage changes very rapidly to the other inverted conduction state at or at least very near to a zero crossing of the voltage difference between the base inputs 7 and 8. As the transistors 3 and 4 are continuously in the conducting state, these sudden changes in state become evident, without delay, as particularly steep pulse edges in the differential collector voltage of the transistors 3 and 4.

Starting from a predetermined oscillator frequency, direct currents $I_9$ and $I_{10}$ each having a value of 0.5 mA, a step-wise variation of the direct current $I_{11}$, and collector resistors 5 and 6 each having a value of 200Ω, the following test results were obtained in the practical embodiment as regards the amplitude (A) of the oscillator mixing signal at the oscillating mixing input 14, 15 of the mixer stage M, the slew rate (SR) of this oscillator mixing signal and the noise factor (NF) of the mixer stage M, respectively:

| $I_{11}$ (mA) | 1 | 2 | 3 | 4 |
|---|---|---|---|---|
| A (mV-peak peak) | 250 | 500 | 750 | 1100 |
| SR (mV/n sec.) | 350 | 750 | 1300 | 1800 |
| NF (dB) | 9.85 | 6.95 | 6.45 | 6.25 |

The oscillator voltage at the base inputs of the differential input stage 3, 4, which is at least required to initiate the Schmitt trigger 1, 2, had an amplitude of 10 mV rms which amplitude also indicates the magnitude of the hysteresis of the bistable trigger circuit 1-11.

In practice such a hysteresis is acceptable. If a further decrease of the hysteresis is desired, then the quiescent current through the transistors 3 and 4 ($I_{10}$ and $I_9$) must be chosen to exceed the above-mentioned value or must even be chosen to be high relative to the current ($I_{11}$) switched in the Schmitt trigger 1, 2. However, as a result thereof the current consumption of the bistable trigger circuit 1-11 increases to a particularly high extent. In order to keep this current consumption as low as possible, it is preferred, in practice, to choose the said quiescent current to be less than the switched current and an acceptable hysteresis is obtained with a quiescent current which is at least ⅛ of the switched current, observing the beforementioned current limit values for an adequate operation of the Schmitt trigger 1, 2.

It is obvious that the invention is not limited to the embodiment shown and described. It is e.g. also possible to apply the inventive idea with, for example, a flip-flop used as the bistable trigger circuit and/or with an additive unbalanced mixer stage M as used in the said tuning unit UV 411.

What is claimed is:

1. An RF-tuning device comprising a switching mixer stage for receiving an RF-input signal and a tuning oscillator coupled to an oscillator signal input thereof, characterized in that a bistable trigger circuit is connected between the tuning oscillator and the switching mixer stage oscillator signal input to increase the slew rate of an oscillator signal applied to said switching mixer stage oscillator signal input, wherein said bistable trigger circuit is actuated by zero crossings in an output signal of the tuning oscillator causing said bistable trigger circuit to generate a substantially square-wave output signal for application to said mixer stage as said oscillator signal.

2. An RF-tuning device as claimed in claim 1, characterized in that the bistable trigger circuit comprises a differential input stage and a Schmitt trigger connected thereto, the differential input stage being coupled to an output of the tuning oscillator and the Schmitt trigger being coupled to a multiplying circuit included in the switching mixer stage.

3. An RF-tuning device as claimed in claim 2, characterized in that the Schmitt trigger comprises first and second transistors, the base inputs of these transistors being cross-coupled to the opposite collector outputs and being connected to first and second direct current sources, respectively, and the emitters of these transistors being connected to a common third direct current source, the currents through the first and second direct current sources being mutually substantially equal and the current through the third direct current source being not more than eight times the current through each of the first and second direct current sources, and that the differential input stage comprises third and fourth mutually balanced transistors, whose base inputs are connected to the output of the tuning oscillator and whose collector outputs are connected to a balanced input of the multiplying circuit.

* * * * *